(12) United States Patent
Jung et al.

(10) Patent No.: US 8,150,491 B2
(45) Date of Patent: Apr. 3, 2012

(54) METHOD FOR ACCELERATING DATA ACQUISITION IN DYNAMIC MAGNETIC RESONANCE MEASUREMENTS (MRT) USING PARALLEL IMAGING

(75) Inventors: Bernd Jung, Freiburg (DE); Peter Ullmann, Karlsruhe (DE)

(73) Assignee: Universitaetsklinikum Freiburg, Freiburg (DE)

( * ) Notice: Subject to any disclaimer, the term of this patent is extended or adjusted under 35 U.S.C. 154(b) by 1146 days.

(21) Appl. No.: 11/954,428

(22) Filed: Dec. 12, 2007

(65) Prior Publication Data

US 2008/0242972 A1 Oct. 2, 2008

(30) Foreign Application Priority Data

Mar. 29, 2007 (DE) .......................... 10 2007 015 040

(51) Int. Cl.
*A61B 5/05* (2006.01)

(52) U.S. Cl. ........ 600/410; 600/407; 345/418; 345/419; 382/128

(58) Field of Classification Search .................. 600/407, 600/410; 324/310; 345/418, 419; 382/128
See application file for complete search history.

(56) References Cited

U.S. PATENT DOCUMENTS

| 6,841,998 | B1 | 1/2005 | Griswold |
| 2006/0184000 | A1 | 8/2006 | Wang |
| 2006/0208731 | A1 | 9/2006 | Wang |
| 2006/0273792 | A1* | 12/2006 | Kholmovski et al. ......... 324/309 |

OTHER PUBLICATIONS

Huang et al., k-t GRAPPA: A k-space Implementation for Dynamic MRI with High Reduction Factor, 2005, Magnetic Resonance in Medicine, vol. 54, pp. 1172-1184.*

Breuer et al., Dynamic Autocalibrated Parallel Imaging Using Temporal GRAPPA (TGRAPPA), 2005, Magnetic Resonance in Medicine, vol. 53, pp. 981-985.*
Martin Blaimer et al. "2D-GRAPPA-Operator for Faster 3D Parallel MRI". Magnetic Resonance in Medicine 56:1359-1364 (2006.
Felix A. Breuer et al. "Controlled Aliasing in Parallel Imaging Results in Higher Acceleration (CAIPIRINHA) for Multi-Slice Imaging". Magnetic Resonance in Medicine 53:684-691 (2005).
Feng Huang et al. "k-t GRAPPA: A k-space Implementation for Dynamic MRI with High Reduction Factor". Magnetic Resonance in Medicine 54:1172-1184 (2005).

(Continued)

*Primary Examiner* — James Kish
(74) *Attorney, Agent, or Firm* — Paul Vincent

(57) ABSTRACT

A method for time-resolved imaging of N-dimensional magnetic resonance (=MR) with the following steps:
Acquisition of MR signals from a sample volume by parallel imaging, wherein N-dimensional data matrices (M1, M2, ... MNt) in k-space is acquired undersampled from each receiver coil, wherein the acquisition of the MR signals is performed according to an acquisition scheme that is periodic over time and describes the time sequence of the undersampled data matrices (M1, M2, ... Mn) and
reconstruction of missing data points (FP) of the acquisition scheme using a set of coil weighting factors (CW, <CW>) and using N+1-dimensional reconstruction kernels (RK, RK' RK") is characterized in that reconstruction of the missing data points (FP) is performed using a single reconstruction geometry, wherein each reconstruction kernel comprises an (N+1)-dimensional target area (TB), wherein all non-acquired data points (TP) are reconstructed within the associated target area (TB) using each reconstruction kernel (RK, RK' RK"), and wherein the target area (TB) exhibits at least the extent (nR×mR) in the ky-t plane of the acquisition scheme. This can shorten the computation time for reconstruction and reduce reconstruction artifacts and optimize the signal-to-noise ratio.

8 Claims, 5 Drawing Sheets

OTHER PUBLICATIONS

Jeffrey Tsao et al. "k-t BLAST and k-t SENSE: Dynamic MRI with High Frame Rate Exploiting Spatiotemporal Correlations". Magnetic Resonance in Medicine 50:1031-1042 (2003).

Felix A. Breuer et al. Dynamic Autocalibrated Parallel Imaging Using Temporal GRAPPA (TGRAPPA). Magnetic Resonance in Medicine 53:981-985 (2005).

Peter Kellmann et al. "Adaptive Sensitivity Encoding Incorporating Temporal Filtering (TSENSE)". Magnetic Resonance in Medicine 45:846-852 (2001).

Daniel K. Sodickson et al., "Simultaneous Acquisition of Spatial Harmonics (SMASH): Fast Imaging with Radiofrequency Coil Arrays". Magnetic Resonance in Medicine 38:591-603 (1997).

Mark A. Griswold et al. "Generalized Autocalibrating Partially Parallel Acquisitions (GRAPPA)". Magnetic Resonance in Medicine 47:1202-1210 (2002).

Klaas P. Pruessmann et al. "SENSE: Sensitivity Encoding for Fast MRI". Magnetic Resonance in Medicine 42:952-962 (1999).

Felix A. Breuer et al. "Controlled Aliasing in Volumetric Parallel Imaging (2D CAIPIRINHA)". Magnetic Resonance in Medicine 55:549-556 (2006).

Suyash P. Awate et al. "Model-Based Image Reconstruction for Dynamic Cardiac Perfusion MRI from Sparse Data". IEEE Engineering in Medicine and Biology Soc. (EMBS) 2006.

* cited by examiner

METHOD FOR ACCELERATING DATA ACQUISITION IN DYNAMIC MAGNETIC RESONANCE MEASUREMENTS (MRT) USING PARALLEL IMAGING

BACKGROUND OF THE INVENTION

This application claims Paris Convention priority of DE 10 2007 015 040.9 filed on Mar. 29, 2007.

The invention relates to a method for time-resolved imaging of N-dimensional magnetic resonance (=MR) with the following steps: Acquisition of MR signals from a sample volume by parallel imaging using multiple receiver coils, wherein a number of NtN-dimensional data matrices in k-space is acquired undersampled with reduction factor R from each receiver coil, wherein ky is the phase-encoding direction, and wherein the acquisition of the MR signals is performed according to an acquisition scheme that is periodic over time and describes the time sequence of the undersampled data matrices and reconstruction of missing data points of the acquisition scheme using a set of coil weighting factors and using N+1-dimensional reconstruction kernels that define from which acquired data points reconstruction will be performed.

Such a method is known from [7].

Parallel Imaging

Parallel imaging in MRT was first presented in 1997 [1] and is based on the use of coil arrays (multiple coil elements for simultaneous data acquisition), whose spatial variation in sensitivity is used for additional spatial encoding of the MR signal. Parallel imaging permits reduction of the acquisition time without any loss of spatial or temporal resolution of the data. Reduction of data acquisition entails undersampling of a data matrix. This data matrix comprises all points in the k-space of the volume under examination to be imaged at a certain measurement instant (data points), i.e. not all data points are measured during parallel imaging. This results in spatial aliasing (fold-over) of the images. Calculation of the missing data can either be performed as an unfolding process in the image space (SENSE) [3] or directly in the data matrix (k-space) by calculating the missing k-space rows (GRAPPA) in the data matrix [2]. The maximum reduction factor R of undersampling of the data matrix is determined by the number of coil elements for data acquisition.

One problem with implementation is that the use of parallel imaging with increasing reduction factors results both in a clear increase in reconstruction artifacts in the images and in a drastic drop in the signal-to-noise ratio (SNR) in the reconstructed images. For example, with eight coil elements, the maximum reduction factor at which images can still be obtained whose image artifacts and SNR permit their use for diagnosis in clinical applications is approximately 3.

GRAPPA (GeneRalized Autocalibrating Partially Parallel Acquisition)

In the reconstruction process of the k-space-related GRAPPA technique, calculation of the missing k-space rows for image reconstruction and combining the coil images reconstructed with it are disconnected. For that reason, reconstruction of the missing data can be optimized separately, allowing robust and optimized parallel image reconstruction.

For calculation of the missing data points of the undersampled data matrix, it is first necessary to determine the spatial sensitivities of the individual coil elements that are described by the 'coil weighting factors'. This defines a 'kernel' that exhibits a certain extent in the spatial direction and comprises both acquired data points (source points) and non-acquired data points (target points). To determine the coil weighting factors and to reconstruct the target points within the kernel, a certain number of source points of the kernel are used.

Parallel Imaging with Temporal and Spatial Information

By including adjacent temporal and spatial information, the quality of parallel imaging reconstruction can be increased, permitting the use of higher reduction factors than in conventional parallel imaging [4-7]. In the TSENSE [4] (SENSitivity Encoding for fast NMR incorporating temporal filtering) and TGRAPPA [5] techniques, data from adjacent measurements are merged to yield the coil weighting factors for the reconstruction process. In kt-SENSE and kt-BLAST [6] (Broad-use Linear Acquisition Speed-up Technique) and in kt-GRAPPA [7], the temporal information contributes directly to the reconstruction process. One disadvantage of the kt-SENSE/kt-BLAST techniques is the restriction to quasi-periodic movement, such as in cardiac imaging. A further disadvantage of the kt-GRAPPA technique is the use of multiple kernels with different geometries for determining the coil weighting factors and the reconstruction, which can result in systematic errors and therefore in image artifacts and can also necessitate long computation times.

For multiple-slice imaging and 3D imaging, methods have been disclosed in which information from spatially adjacent slices was used for reconstruction of missing data rows [8-10]. The acquisition scheme that describes the time sequence of the data matrices differs from that in kt-GRAPPA in that the temporal dimension is replaced by a third spatial direction.

SUMMARY OF THE INVENTION

The object of this invention is to propose a method of the type stated above by which the computation times can be shortened and the reconstruction artifacts reduced. At the same time, the signal-to-noise ratio is to be optimized.

This object is inventively achieved by performing reconstruction of the missing data points of the acquisition scheme by means of a single kernel geometry, wherein each reconstruction kernel comprises an N+1 dimensional target area, wherein all non-acquired data points are reconstructed within the associated target area by means of each reconstruction kernel, and wherein the target area has at least the extent (nR×mR) in the ky-t plane of the acquisition scheme, where n,m=1,2, . . . .

Unlike the known kt-GRAPPA method, the inventive method envisages the use of N+1 dimensional reconstruction kernels with standard geometry for the reconstruction of all missing data points in the N+1 dimensional data matrix in parallel dynamic, i.e. time-resolved, N-dimensional imaging with reduction factor R. The reconstruction kernel includes all spatial dimensions and the temporal domain.

The inventive reconstruction kernel includes an N+1-dimensional target area whose extent in the ky-t plane is determined by the reduction factor of the measurement. The target area is a subset of k-t space and comprises both data points acquired during undersampling and data points not acquired during undersampling. According to the invention, all acquired points of the target area are source points, i.e. are used for the reconstruction of the missing data points, and all non-acquired data points of the target area are target points, i.e. are reconstructed by means of the source points of a certain reconstruction kernel.

For reconstruction of data points of different target areas, different reconstruction kernels are used which, however, all exhibit the same geometry, i.e. all reconstruction kernels within an acquisition scheme exhibit the same extent within the k-t space and the same disposition of source points and target points relative to each other. In this way, the computation time required for the reconstruction can be reduced and artifacts minimized.

Preferably, after reconstruction of the data points within a target area, the reconstruction kernel and the target area are shifted in the ky and/or t direction within the acquisition scheme by an increment of an integer multiple of R. In this way, successive target points of adjacent target areas can be reconstructed.

In an embodiment of the inventive method, the reconstruction kernel is equal to the target area. This is the minimum configuration of the inventive reconstruction kernel, i.e. it contains the minimum number of source points that are necessary to reconstruct all target points of this target area.

Nevertheless, it can be advantageous if the reconstruction kernel comprises acquired data points outside the target area. In this case, further data points acquired within the acquisition scheme that are not part of the target limitation contribute to reconstruction. The extent of the reconstruction kernel is then greater than that of the target area. In principle, any extent of the reconstruction kernel is possible. The decisive aspect is that only reconstruction kernels with the same geometry are used for reconstruction of the various data points of an acquisition scheme.

Preferably, the set of coil weighting factors is calculated by acquiring all data points in a calibration area of the acquisition scheme around ky=0, a kernel is selected from this calibration area and the generalized inverse is calculated from this kernel. This kernel has the same geometry as the reconstruction kernel. Reconstruction kernels with standard geometry are therefore used both to determine the coil weighting factors and to reconstruct all missing rows in the N+1 dimensional data matrix. In a 4-dimensional acquisition scheme, i.e. with three spatial dimensions (N=3), the calibration area is located around ky=0 and kz=0.

In an especially preferred embodiment, M sets of coil weighting factors are calculated and the kernels from which the M sets of coil weighting factors are calculated are mutually offset within the calibration area in the t direction. From these M sets of coil weighting factors, an averaged set of coil weighting factors is then calculated. In principle, any number of sets of coil weighting factors can be calculated, however the maximum is Nt+bt+1, where Nt is the number of acquired data matrices and bt is the extent of the kernel in the t direction.

In the inventive method, the data points of the acquisition scheme are preferably MR data for 3D CINE and/or phase contrast and/or perfusion and/or diffusion tensor imaging and/or realtime acquisitions.

The inventive method permits reconstruction of dynamic N-dimensional magnetic resonance tomography (MRT) image series with interleaved undersampling of the acquisition scheme (k-t space) with simultaneous inclusion of temporal information. As compared with the prior art, the inventive method achieves minimization of reconstruction artifacts in, for example, MRT images by use of N+1-dimensional reconstruction kernels with a standard geometry for the entire acquisition scheme with simultaneous optimization of the signal-to-noise ratio and the reconstruction time.

Further advantages of the invention are derived from the description and the drawing. Moreover, the characteristics stated above and detailed below can be used singly or in any combination. The embodiments shown and described are not to be understood as an exhaustive list but are examples to describe the invention.

DESCRIPTION OF THE PREFERRED EMBODIMENT

Figure 6:
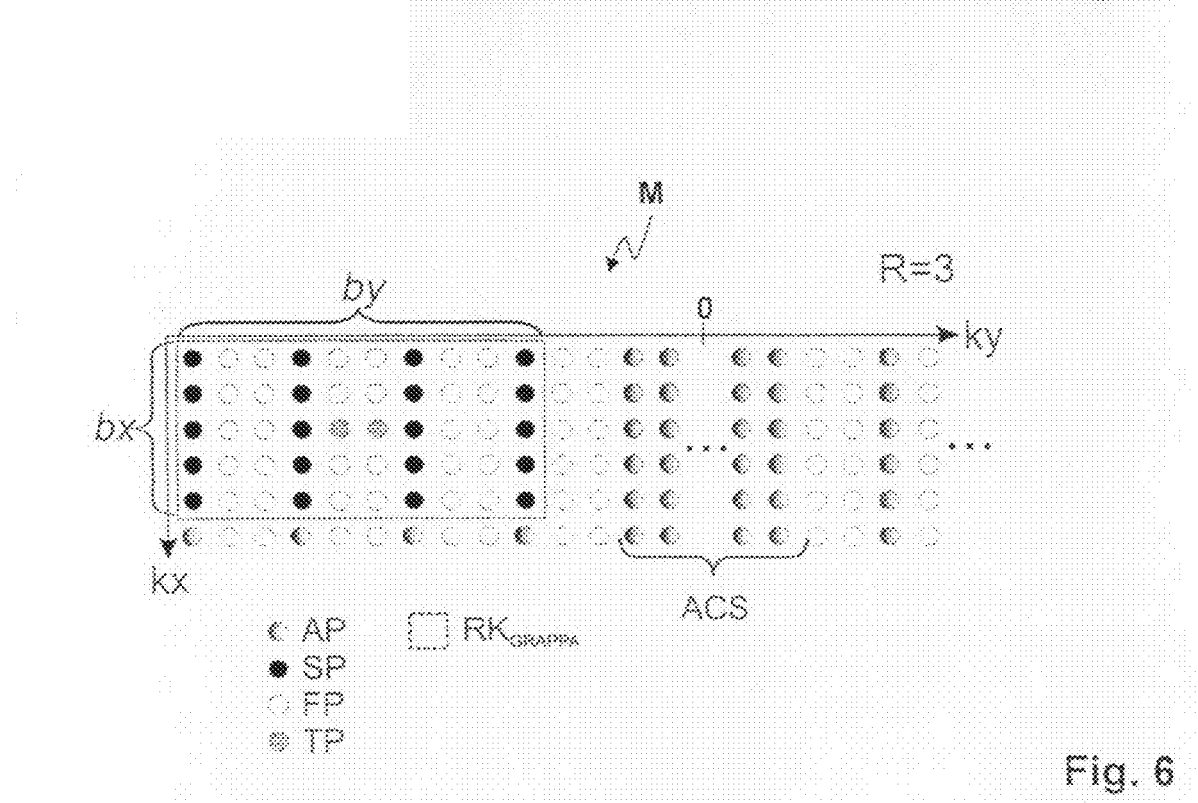
FIG. 6 A data matrix with a reconstruction kernel of a conventional GRAPPA method (prior art)

FIG. 6 shows the method of functioning of a reconstruction of data points with parallel imaging using the known GRAPPA method. Each coil of a coil array produces a data matrix M (in this case: two-dimensional). The data matrix M is undersampled (with a reduction factor of R=3 in the example shown). It comprises acquired data points AP and non-acquired (missing) data points FP. Data points of the same phase-encoding ky form a data row. With the aid of a reconstruction kernel $RK_{GRAPPA}$, some of the missing points, i.e. target points TP, can be reconstructed. The reconstruction kernel $RK_{GRAPPA}$ comprises source points SP (acquired data points that are used for reconstruction), the target points TP to be reconstructed from these source points, and further non-acquired data points FP and acquired data points AP that are not used for reconstruction. The reconstruction kernel $RK_{GRAPPA}$ defines which data points (target points TP) are to be reconstructed using which data points (source points SP). For the reconstruction of R−1=2 target points TP, mutually adjacent source points SP with four different phase-encodings ky (i.e. from four adjacent acquired data rows) are used. In the example shown, the reconstruction kernel $RK_{GRAPPA}$ has an extent of bx=5 in the kx direction and by=3R+1 in the ky direction.

At the center of the data matrix M (around ky=0), calibration rows ACS (typically 16-32 data rows) are acquired in full. These calibration rows ACS are used to determine coil weighting factors that are required for reconstruction of the target points TP.

Figure 7:
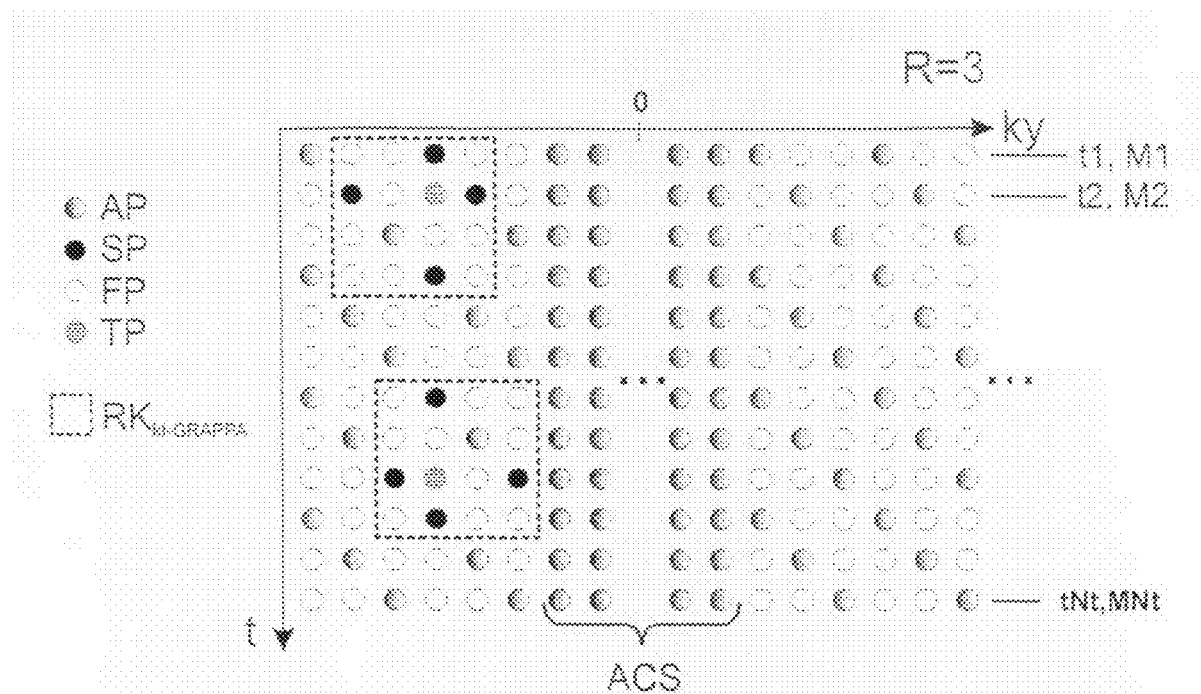
FIG. 7 An acquisition scheme of an acquisition that is periodic over time with a reconstruction kernel of a conventional kt-GRAPPA method (prior art)

FIG. 7 shows the ky-t plane of an acquisition scheme that is periodic over time, for the reconstruction of data points in parallel imaging using the known kt-GRAPPA method. In this method, the influence of adjacent temporal information is used to improve the quality of reconstruction. At every measurement instant t1, t2, ... tNt, a data matrix M1, M2, ... MNt is acquired, of which only the data points for a particular kx value are depicted in FIG. 7. In this case, measurement instant t1, t2, . . . tNt refers to the time at which the corresponding data matrix M1, M2, . . . MNt is mapped. The different data matrices M1, M2, . . . MNt repeat periodically with R data matrices M1, M2, . . . MR being acquired in each cycle. In the case shown with reduction factor R=3, data matrix M1 at measurement instant t1 therefore corresponds to data matrices M4, M7, M10 at measurement instants t4, t7, t10, etc.

From the calibration rows ACS acquired in the center of the k-space, the coil weighting factors are determined from which the target points TP can then be calculated. To reconstruct a target point TP, two source points SP adjacent to the target point TP in the ky direction and t direction are used. In this example, this results in a reconstruction kernel $RK_{kt\text{-}GRAPPA}$ with an extent of 4×4 in the kt-t plane. In the kt-GRAPPA method, only a single target point TP is reconstructed in a reconstruction step, i.e. by use of a reconstruction kernel $RK_{kt\text{-}GRAPPA}$. To reconstruct all missing data points FP of the acquisition scheme, it is necessary to generate reconstruction kernels $RK_{kt\text{-}GRAPPA}$ with R−1 different kernel geometries. In this example, the number of kernel geometries is two.

Figure 8:
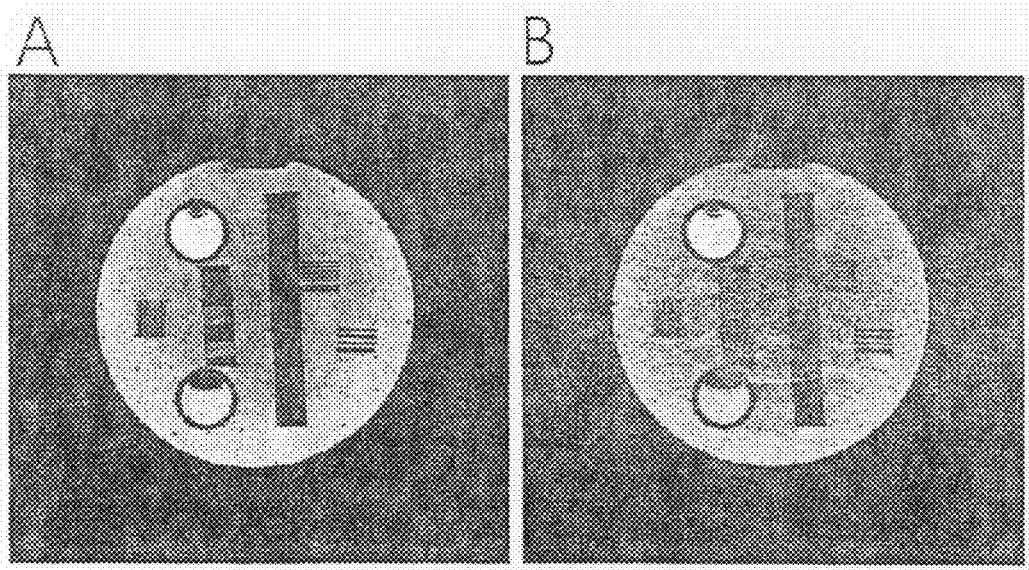
FIG. 8a An image of a phantom acquired using parallel imaging with a fully acquired data matrix (prior art), and FIG. 8b An image of a phantom acquired using parallel imaging with an undersampled data matrix (prior art).

FIG. 8a, 8b each show an acquired image of a phantom. Whereas the image of the phantom in FIG. 8A was acquired using fully acquired data matrices (R=1), the image shown in FIG. 8B used the GRAPPA method with a reduction factor of R=6. By comparison with acquisition with R=1, i.e. without parallel imaging (FIG. 8A), the image reconstructed with a reduction factor of R=6 (FIG. 8B) exhibits clear image artifacts and a strongly reduced signal-to-noise ratio, which results in a clear increase of reconstruction artifacts in the images.

Figure 1:
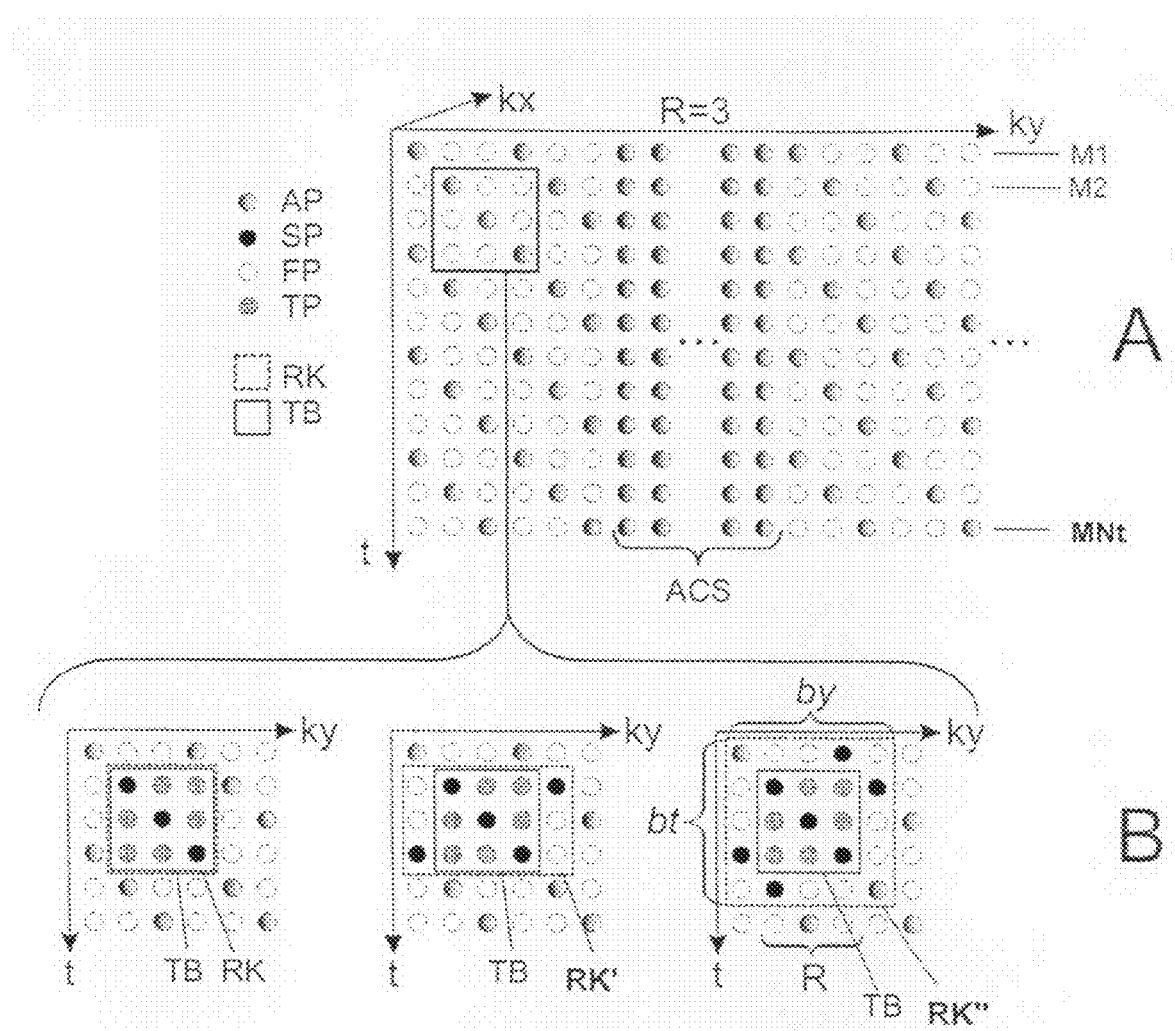
FIG. 1a An acquisition scheme with an acquisition that is periodic over time according to the inventive method (PEAK-GRAPPA)
FIG. 1b Various reconstruction kernel configurations of the inventive method.

Unlike the known kt-GRAPPA method, the inventive method for reconstruction of all non-acquired data points FP uses only one kernel geometry. FIG. 1a shows an acquisition scheme of a coil element that corresponds to that of FIG. 7 with a reduction factor R=3 and a calibration area with calibration rows ACS, and a target area TB, the target area TB being at least an R×R-sized matrix that contains target points TP and source points SP.

FIG. 1b shows examples of three possible kernel configurations for a reconstruction kernel RK, RK', RK" that can be used with the inventive method for an acquisition scheme with a reduction factor of R=3. For two-dimensional imaging, the extent of the reconstruction kernel RK, RK', RK" is bx in the kx direction, by in the ky direction and bt in the t direction. On the left in FIG. 1B, the reconstruction kernel RK is shown with a minimum extent of R×R (in this case by=bt=3) in the ky-t plane (minimum kernel configuration). This reconstruction kernel RK with minimum extent exactly matches the target area TB. The reduction factor R is the lower limit for the number $N_{source}$ of source points SP. The reconstruction kernel RK', RK" can also contain further data points outside the target area TB ($N_{source}>=R$), as shown in the center and left examples in FIG. 1B. In the case of the kernel configuration shown in the center of FIG. 1B (reconstruction kernel RK'), data points with two further phase-encodings ky contribute to reconstruction of the target points TP. The number $N_{source}$ of the source points SP is 5 in this case. In this case, the extent by of reconstruction kernel RK' in the ky direction is therefore larger than the extent of the target area TB ($N_{source}=5$, where by=5 and bt=3). The kernel geometry of the reconstruction kernel RK" shown on the right in FIG. 1B differs both in its extent by in the ky direction and in its extent bt in the t direction from the corresponding extents of the target area TB ($N_{source}=7$, where by=bt=5).

When the reconstruction kernel RK with minimum extent (minimum kernel configuration) is used, all acquired data points AP within the reconstruction kernel RK are used as source points SP. However, in the case of reconstruction kernel RK" shown on the right in FIG. 1B, several acquired data points AP outside the target area TB are not used for the reconstruction of the target points TP.

Unlike the known kt-GRAPPA method in which only one target point TP is reconstructed in each reconstruction step, in the inventive method, all data points with the extent nR×mR that are not used as source points SP are reconstructed within the target area TB in one reconstruction step, i.e. using a certain reconstruction kernel RK, RK', RK".

To calculate all missing data points FP of the entire acquisition scheme, the reconstruction kernel RK, RK', RK" is shifted in the ky and t directions over the ky-t plane by an increment of R after each reconstruction step. For greater clarity, the x direction is not shown here. The example shown in FIG. 1A is of a three-dimensional acquisition scheme. The reconstruction of the data points with a different kx value from that shown in FIG. 1A additionally requires a shift of the reconstruction kernel RK, RK', RK" in the kx direction. In the case of time-resolved spatial 3D data, the reconstruction kernel RK, RK', RK" also has an extent in the kz direction, preferably size R. In principle, any extent of the reconstruction kernel RK', RK" is possible as long as it comprises the target area TB.

Only one of the possible kernel configurations is used for reconstruction of the missing data points FP within an acquisition scheme.

Figure 2:
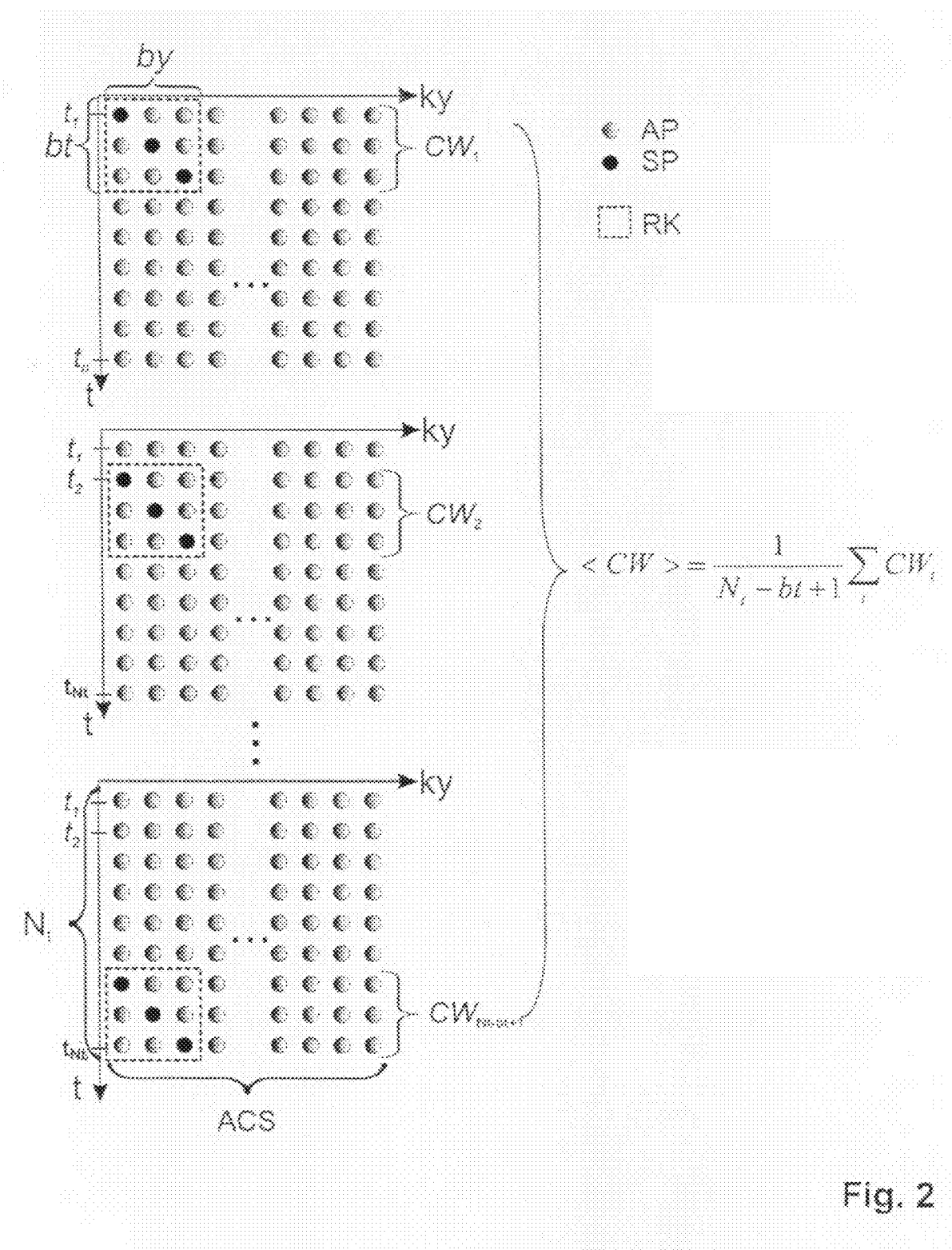
FIG. 2 The calibration area of the acquisition scheme from FIG. 1.

FIG. 2 illustrates the determination of the coil weighting factors that are required for reconstruction of the missing data points FP. Using a kernel K having the same geometry as the reconstruction kernel RK subsequently used for reconstruction, a reconstruction scheme for reconstruction of the target points TP is created within the corresponding kernel geometry. For this purpose, the generalized inverse of a matrix is calculated whose dimension is determined, among other factors, by the number of contributing instants t1, t2 . . . tNt. In the inventive method, all acquired ACS rows in the temporal direction t can be used for calculation of this generalized inverse.

Especially good results can be achieved if M sets $CW_t$ (t=1,2, . . . n) of coil weighting factors are calculated by calculating a set $CW_t$ of coil weighting factors from the area in the temporal dimension of the extent bt and then shifting this area in the temporal direction step by step with an increment of 1 and in each case determining a further set $CW_t$ of coil weighting factors. The maximum number $M_{max}$ of sets $CW_t$ of coil weighting factors is determined by $M_{max}=N_t-bt+1$. FIG. 2 shows this schematically for a kernel K with the extent by=bt=3. The kernel can be shifted over the entire calibration area.

Preferably, the kernel is shifted in the kx and ky direction over the calibration area for each measurement instant t within the acquisition scheme and therefore produces Nt−bt+1 sets $CW_t$ of coil weighting factors, which are then averaged to form a set <CW>. The target points can then be reconstructed from this set <CW> of coil weighting factors.

The reconstruction kernel RK, RK', RK" used for reconstruction of the missing data points of an acquisition scheme and the kernel K used to calculate the coil weighting factors have a standard geometry and are chosen such that a single set CW, <CW> of coil weighting factors can be calculated for the entire acquisition scheme, with which all non-acquired data points can be reconstructed in the acquisition scheme. Each reconstruction kernel RK, RK', RK" with a target area TB of nR×mR (where n,m=1,2, ... ) meets this condition for the acquisition scheme shown in FIG. 1A. The extent of the kernel bx in the kx direction, which, for greater clarity, is not shown here, can contain any number of k-space rows (typically bx=5). If there are further dimensions, the kernel dimensions are correspondingly greater. For 3D data, for example, the kernel also has an extent in the kz direction.

Because of the expansion of the reconstruction kernel and averaging of the coil weighting factors over the temporal dimension, the inventive method is termed PEAK-GRAPPA (for Parallel imaging with Extended and Averaged GRAPPA Kernels).

Figure 3:
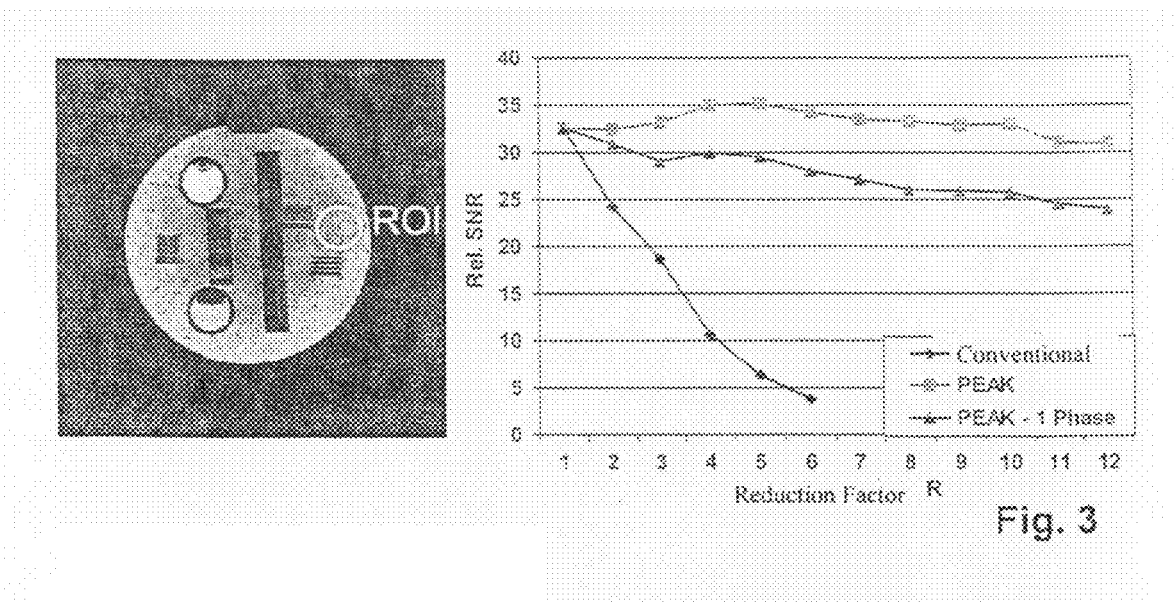
FIG. 3 The dependency of the signal-to-noise ratio on the reduction factor in a region of the static phantom for conventional GRAPPA, PEAK-GRAPPA without and with averaging of the coil averaging factors over time.

FIG. 3 shows a signal-to-noise analysis depending on the reduction factor R in a region ROI of a static phantom for various reconstruction methods. The analysis was obtained using two image series acquired one after the other with identical parameters. To take into consideration the spatial dependency of the signal-to-noise ratio in parallel imaging, the reconstructed images of identical instants from the two image series were averaged and subtracted. The signal-to-noise ratio then results from the signal of the averaged image within an image region divided by the standard deviation of the signal from the subtraction image (noise) within the same region.

For reconstruction with the conventional GRAPPA technique (diamonds), the signal-to-noise ratio, as expected, becomes poorer for high reduction factors. With the reconstruction with the inventive PEAK-GRAPPA method, on the other hand, the signal-to-noise ratio with higher reduction factors remains in the value range for reconstruction with a full data matrix (R=1). It has been shown that averaging over time of the coil weighting factors results not only in the improvement of the image quality but in further optimization of the noise (squares) as compared with reconstruction using coil weighting factors determined from one instant only (or more precisely with the kernel described above at a certain position in the temporal dimension) (triangles).

FIG. 3 clearly shows that by averaging the sets of coil weighting factors CW to form one set <CW>, the signal-to-noise ratio in the images can be optimized and the image quality improved.

By the inventive method, it is therefore possible to achieve improved image quality with higher reduction factors and therefore correspondingly shortened measurement times. The reduction factor that can be used with the inventive method can therefore, unlike the conventional GRAPPA method, also be greater than the number of coil elements used.

Figure 4:
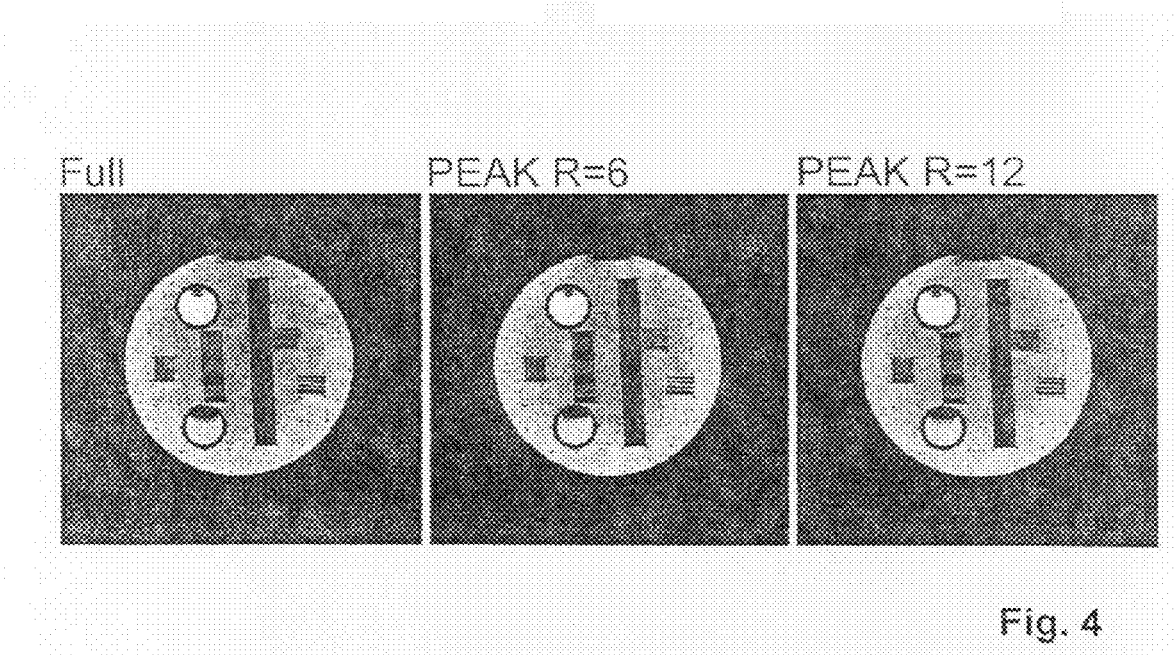
FIG. 4 Images of a phantom acquired using the inventive method with a fully acquired data matrix, with reduction factor 6 and with reduction factor 12.

FIG. 4 shows MRI images of a static phantom that were reconstructed with various reduction factors. The left-hand illustration shows the image reconstructed using the fully acquired data set (R=1). In the center illustration, data rows were removed according to the acquisition scheme shown in FIG. 1A with a reduction factor of R=6 and the missing data points reconstructed using the inventive PEAK-GRAPPA reconstruction method. The right-hand image shows the result of a PEAK-GRAPPA reconstruction with a reduction factor of R=12. The image quality at R=6 is comparable with the fully acquired image and only minimal image artifacts can be seen even with the high reduction factor of R=12.

Figure 5:
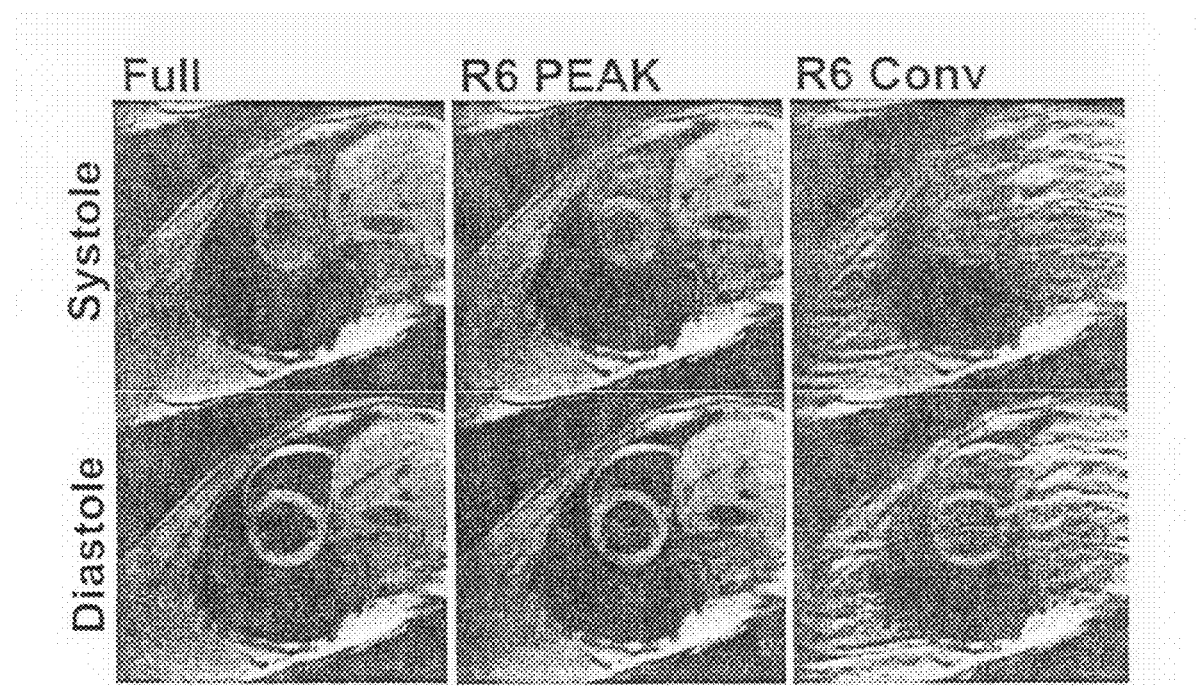
FIG. 5 In-vivo images of the heart reconstructed with the full data matrix (left), with PEAK-GRAPPA (center) and conventional GRAPPA (right), each with a reduction factor of 6.

FIG. 5 shows in-vivo images of the heart. The images were acquired while the heart was beating. The upper row shows images at an instant during the systole of the cardiac cycle and the lower row, at an instant during the diastole. The left-hand acquisitions were reconstructed with fully acquired data matrices. In the center and right-hand acquisitions, data rows were removed using a reduction factor of R=6. The center images were reconstructed using the inventive PEAK-GRAPPA method, while for the right-hand images the conventional GRAPPA method was used. While the images reconstructed with the inventive PEAK-GRAPPA method provide image quality comparable to images with fully acquired data matrices, the images reconstructed using the conventional GRAPPA method exhibit pronounced artifacts and a reduced signal-to-noise ratio.

The inventive method can be applied to all MR sequence techniques, such as gradient echo, spin echo, or echo planar imaging methods.

LIST OF REFERENCE SIGNS

ACS Calibration rows
AP Acquired point
FP Non-acquired point
M1, M2, ... MNt Data matrix
RK Minimum reconstruction kernel
RK', RK" Reconstruction kernel
$RK_{GRAPPA}$ Reconstruction kernel for the GRAPPA method
$RK_{kt\text{-}GRAPPA}$ Reconstruction kernel for the k-t GRAPPA method
SP Source point
TB Target area
TP Target point
ky Phase-encoding
bt Kernel extent in the temporal direction
by Kernel extent in the phase-encoding direction

REFERENCES

[1] Sodickson D K, Manning W J. Simultaneous acquisition of spatial harmonics (SMASH): fast imaging with radiofrequency coil arrays. Magn Reson Med 1997;38: 591-603.

[2] Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002;47: 1202-1210

[3] Pruessmann K P, Weiger M, Scheidegger M B, Boesiger P. SENSE: sensitivity encoding for fast MRI. Magn Reson Med 1999;42(5):952-962.

[4] Kellman P, Epstein F H, McVeigh E R. Adaptive sensitivity encoding incorporating temporal filtering (TSENSE). Magn Reson Med 2001;45(5):846-852

[5] Breuer F A, Kellman P, Griswold M A, Jakob P M. Dynamic autocalibrated parallel imaging using temporal GRAPPA (TGRAPPA) Magn Reson Med 2005;53(4):981-985

[6] Tsau J, Boesinger P, Pruessmann K P. k-t BLAST and k-t SENSE: dynamic MRI with high frame rate exploiting spatiotemporal correlations. Magn Reson Med 2003;50(5):1031-1042.

[7] Huang F, Akao J, Vijayakumar S, Duensing G R, Limkeman M. k-t GRAPPA: a k-space implementation for dynamic MRI with high reduction factor. Magn Reson Med 2005;54(5):1172-1184

[8] Breuer F A, Blaimer M, Heidemann R M, Mueller M F, Griswold M A, Jakob P M. Controlled aliasing in parallel imaging results in higher acceleration (CAIPIRINHA) for multi-slice imaging. Magn Reson Med 2005;53(3):684-691

[9] Blaimer M, Breuer F, Mueller M, Seiberlich N, Ebel D, Heidemann R M, Griswold M A, Jakob P M. 2D-GRAPPA-operator for faster 3D parallel MRI. Magn Reson Med 2006;56(6):1359-1364

[10] Breuer F A, Blaimer M, Mueller M F, Seiberlich N, Heidemann R M, Griswold M A, Jakob P M. Controlled aliasing in volumetric parallel imaging (2D CAIPIRINHA). Magn Reson Med 2006;55(3):549-556

We Claim:

1. A method for time-resolved imaging of N-dimensional magnetic resonance, wherein N is a total number of dimensions and includes all spatial and temporal dimensions, the method comprising the steps of:
   a) acquiring MR signals from a sample volume by parallel imaging using multiple receiver coils, wherein a plurality of data matrices in k-space is acquired undersampled with a reduction factor R from each receiver coil, wherein ky is a phase-encoding direction, acquisition of the MR signals being performed according to an acquisition scheme that is periodic over time and which describes a time sequence of the undersampled data matrices; and
   b) reconstructing missing data points of the acquisition scheme using a set of coil weighting factors and using N-dimensional reconstruction kernels that define from which acquired data points reconstruction will be performed, wherein reconstruction of the missing data points of the acquisition scheme is performed using a single N-dimensional reconstruction kernel geometry comprising an N-dimensional target area, wherein all non-acquired data points are reconstructed within an associated target area and an extent of a reconstruction kernel in a kx direction is independent.

2. The method of claim 1, wherein after reconstruction of data points within the target area, the reconstruction kernel and the target area are shifted in a ky and/or t direction within the acquisition scheme by an increment of an integer multiple of R.

3. The method of claim 1, wherein the reconstruction kernel is equal to the target area.

4. The method of claim 1, wherein the reconstruction kernel comprises acquired data points outside the target area.

5. The method of claim 1, wherein a set of coil weighting factors is calculated by acquiring all data points of a calibration area in a calibration area of the acquisition scheme around |ky=0|, selecting a kernel from this calibration area, and calculating a generalized inverse for the kernel, wherein the kernel exhibits a same geometry as the reconstruction kernel.

6. The method of claim 1, wherein sets of coil weighting factors are calculated, kernels, from which the sets of coil weighting factors are calculated, being mutually offset in a t direction within the acquisition scheme, wherein an averaged set of coil weighting factors is calculated from these sets of coil weighting factors.

7. The method of claim 1, wherein the data points of the acquisition scheme are MR data for the 3D-CINE and/or phase contrast and/or perfusion and/or diffusion tensor imaging and/or real time acquisitions.

8. The method of claim 1, wherein the target area has at least an extent (R×R) in a ky-t plane of the acquisition scheme.

* * * * *